(12) United States Patent
Matsuura

(10) Patent No.: US 7,230,874 B2
(45) Date of Patent: Jun. 12, 2007

(54) SEMICONDUCTOR STORAGE DEVICE

(75) Inventor: Masanori Matsuura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/937,440

(22) Filed: Sep. 10, 2004

(65) Prior Publication Data
US 2005/0052937 A1 Mar. 10, 2005

(30) Foreign Application Priority Data
Sep. 10, 2003 (JP) ............ P. 2003-318231

(51) Int. Cl.
G11C 8/00 (2006.01)
(52) U.S. Cl. .................. 365/230.06; 365/63
(58) Field of Classification Search ........... 365/230.03, 365/230.06, 51, 63
See application file for complete search history.

(56) References Cited

U.S. PATENT DOCUMENTS 5,602,796 A * 2/1997 Sugio ............ 365/230.06
6,388,472 B1 * 5/2002 Kang ............ 365/230.06
6,477,106 B2 * 11/2002 Fischer et al. ......... 365/230.06
6,608,796 B2 * 8/2003 Weitz ............ 365/230.06
6,914,848 B2 * 7/2005 Jamshidi et al. ....... 365/230.06

FOREIGN PATENT DOCUMENTS

JP 11-177068 1/1999
JP 2000-124782 4/2000

* cited by examiner

Primary Examiner—Trong Phan
(74) Attorney, Agent, or Firm—McDermott Will & Emery LLP

(57) ABSTRACT

At least one transistor (MPX) is connected between a plurality of word line driving element circuits formed by using CMOS inverters (MP0 and MN0, etc.) and a source potential (Vcc). This transistor (MPX) is independently controlled by a control signal (DECENB) separate from control signals (AB-0 to AB-n) of the word line driving element circuits and has both a through current preventing function by adjusting timing and a peak current reducing function by limiting an electric current. Even when all word lines (SWL0 to SWLn) are driven at the same time, the electric current is limited and the peak current is suppressed.

1 Claim, 11 Drawing Sheets

US 7,230,874 B2

SEMICONDUCTOR STORAGE DEVICE

BACKGROUND OF THE INVENTION

1. Field of the Invention

The present invention relates to a semiconductor storage device mounted on an IC card or the like and particularly to a technique for eliminating a through current generated upon operation and reducing a peak current.

2. Description of the Related Art

A semiconductor storage device is strictly requested for its low consumed power. Particularly, in the semiconductor storage device mounted on the IC card or the like, the increase of peak current or consumed current upon operation may possibly result in a problem of malfunction due to the heat generation of the IC card or the sudden fall of source voltage. In recent years, it has been an important problem to reduce the peak current or to reduce the consumed current.

As a usual semiconductor storage device, an EEPROM (a nonvolatile memory capable of being electrically erased or programmed) will be described below as one example by referring to the drawings. FIG. 3 is a sectional view of an element showing the structure of the EEPROM (a storing element) disclosed in Patent Document 1. In the storing element shown in FIG. 3, a plurality of n type layers 10a, 10b and 10c are formed on a p type layer 5. Insulating films (oxide films) 6a, 6b and 8 and gate electrodes 7a, 7b and 9 are laminated and formed on a base. Then, the electrode 9 serves as a connecting terminal of a control word line 1, and the electrode 7a serves as a connecting terminal of a selecting word line 2. The n type layers 10a and 10b respectively function as a source 3 and a drain 4.

When data is written in the storing element, a boosted writing potential Vpp (=about 10 V) is applied to the control word line (a control gate) 1. A negative writing intermediate potential Veel (=about −5V) boosted negatively is applied to the P type layer 5, the source 3 and the drain 4. Thus, voltage of about 15V is applied to the thin oxide film 6b and electrons are injected to a floating gate 7b through the thin oxide film 6b. At this time, the potential of the word line (a selecting gate) 2 is set to an earth potential.

Further, when the data of the storing element is erased, a negatively boosted erasing potential Veeh (=about −10V) is applied to the control word line (the control gate) 1 and a positively boosted erasing potential Vpp (=about 10V) is applied to the P type layer 5. Thus, the electrons are pulled out from the floating gate 7b to the P type layer 5 through the thin oxide film 6b. At this time, the potential of the word line (the selecting gate) 2 is set to a source potential Vcc. The source 3 and the drain 4 are opened.

When the data is written and erased through the thin oxide film 6b, a channel full surface FN tunnel phenomenon is utilized. Thus, the data can be written and erased by low consumed power. Further, when the data of the storing element is read, the source potential Vcc is applied to the word line (the selecting gate) 2 on which the data is to be read, voltage of Vcc/2 about half as high as the source potential is applied to the drain 4, and further, the source 3 and the control word line (the control gate) 1 are grounded. Then, "0" data or "1" data are allowed to correspond to the different quantity of electric current supplied between the drain 4 and the source 3.

As described above, since the storing element does not need to generate high voltage by a boosting circuit upon reading the data, the storing element is suitable for a semiconductor storing element that requires a low consumed current operation such as the IC card.

FIG. 13 is a block diagram showing a structure of one example of a usual selecting word line driving circuit (a word line driver). In FIG. 13, to an address decoder 110, an operation start signal TRG (a reading operation or an erasing operation is performed by receiving the rise of the TRG signal), a READ signal for selecting an input signal upon reading operation, an ERASE signal for controlling an input signal upon erasing operation and an address signal AIN [m:0] are inputted.

The address decoder 110 generates control signals AB0 to ABn in accordance with the address signal AIN [m:0]. The word line driving circuit 120 (the word line driver) includes CMOS inverter drivers (word line driving element circuits) provided respectively correspondingly to word lines. The CMOS inverter drivers respectively comprise complementarily connected P channel MOS transistors (MP0 to MPn) and N channel MOS transistors (MN0 to MNn). The CMOS inverter drivers respectively receive control signals (AB-0 to AB-n) outputted from the address decoder 110 to selectively drive word lines (SWL0 to SWLn) corresponding to an operation mode.

The operation of the word line driving circuit constructed as described above will be described by referring to timing charts shown in FIGS. 14(a) and 14(b). FIG. 14(a) is the timing chart when a reading operation is performed. When the reading operation is carried out, the READ signal is firstly inputted to the address decoder 110 (time t80). Then, the address signal AIN[m:0] for designating an address in which the data is read is inputted (time t81).

At a timing when the TRG signal shifts from L to H (time t82), a signal for designating a selected word line of the word line control signals (AB-0 to AB-n) shifts from H to L (time t83). In FIG. 1, to designate the word line SWL0, an A-0 signal shifts from H to L.

When the control signal AB-0 shifts from H to L (time t83), the source potential is supplied to the word line SWL0 to perform the reading operation. At this time, the P channel MOS transistor MP0 and the N channel MOS transistor MN0 for driving the word line SWL0 are temporarily turned on at the same time and a through current is supplied from the source potential Vcc to an earth potential Vss. Further, to set the word line SWL0 to the source potential Vcc, a peak current is generated.

When the reading operation is completed and the TRG signal shifts from H to L (time t84), the word line control signal AB-0 shifts from L to H (time t85). Thus, the source potential of the word line SWL0 is changed to the earth potential Vss by the word line driving circuit 120.

In this process, the P channel MOS transistor MP0 and the N channel MOS transistor MN0 for driving the word line SWL0 are likewise temporarily turned on at the same time to supply the through current from the source potential Vcc to the earth potential Vss. Further, to drop the word line SWL0 to the earth potential Vss, the peak current is generated.

FIG. 14(b) is a timing chart when an erasing operation is performed. When the erasing operation is carried out, the ERASE signal is inputted to the address decoder 110 (time t90). When the ERASE signal is received, all of the word line control signals AB-0 to AB-n shift from H to L (time t91).

At this time, the source potential is supplied to all the word lines (SWL0 to SWLn) at the same time. During this process, in each of the CMOS inverter drivers for driving each of the word lines (SWL0 to SWLn), the P channel MOS transistor and the N channel MOS transistor are turned on at the same time to supply the through current from the source potential Vcc to the earth potential Vss. Further, to set all the word lines to the source potential Vcc, the peak current is generated.

Further, when the erasing operation is completed, the ERASE signal shifts from L to H (time t92) and all the word line control signals (AB-0 to AB-n) shift from H to L (time t93). Then, the potentials of all the word lines (SWL0 to SWLn) shift to the earth potential Vss.

At this time, in each of the CMOS inverter drivers, the through current likewise flows, and the peak current is generated in accordance with the change of the potentials of all the word lines (SWL0 to SWLn) from the source potential Vcc to the earth potential Vss.

A technique for reducing the through current or the peak current is disclosed in, for instance, Patent Document 2. According to this technique, load MOS transistors are provided in a plurality of output buffer circuits to limit an electric current. Thus, when the plurality of CMOS output buffers are simultaneously operated to invert outputs, a quantity of electric current supplied to each of the CMOS output buffers is limited to entirely reduce a through current during a transition response operation.

| [Patent Document 1] | JP-A-11-177068 |
| [Patent Document 2] | JP-2000-124782 |

According to a technique disclosed in the Patent Document 2, a gate of a load transistor is always opened, so that a through current cannot be completely eliminated. Further, this technique is limited to an output buffer circuit and cannot be applied to a case in which loads (the number of word lines as objects to be driven) are different depending on a reading mode or an erasing mode like a word line driving circuit as an object of the present invention.

Specifically, in an EEPROM, a source potential Vcc needs to be applied to a word line to be read upon reading. Further, data stored in a storing element within a prescribed period needs to be read. To rapidly set the potential of the word line to the source potential Vcc, a transistor having a capacity capable of supplying an electric current as much as possible is required. However, when the transistor having a high capacity capable of supplying a large quantity of electric current is used for a transistor for driving the word line, the quantity of the through current is also undesirably increased.

Further, during an erasing operation, the potentials of all word lines connected to all storing elements need to be set to the source potential Vcc. As soon as the erasing operation is started, the source potential Vcc is supplied to all the word lines at once. Thus, in the word line driving circuits for driving the word lines, the through current is simultaneously supplied and the electric current is abruptly supplied to all the word lines. Accordingly, a large quantity of peak current is generated. At that time, the source potential is lowered to cause a risk of generating a malfunction of a semiconductor storage device.

As described above, in order to meet a demand for a high speed reading operation, it is difficult to make the use of the transistor high in its current supplying capability compatible with the suppression of the through current or the peak current.

SUMMARY OF THE INVENTION

The present invention is proposed by taking these problems into consideration. It is an object of the present invention to make a demand for a high speed reading operation compatible with the suppression of a through current or a peak current, to eliminate a through current while a high speed drive of a word line is maintained and realize a low consumed electric current when a source potential is supplied to one word line during a reading mode or the like, to suppress the change of the source potential not only by preventing the through current, but also by reducing the peak current when the source potential is simultaneously supplied to all selecting gates upon certain operation such as upon erasing mode and to operate a semiconductor storage device in a more stable way.

A semiconductor storage device according to the present invention includes a storing element part having a memory cell provided at the intersection of a word line and a bit line and a word line driving part for driving the word line in the storing element part. The word line driving part comprises: a plurality of word line driving element circuits in which one word line is connected to a drain to which two MOS transistors having different electric conductive types are commonly connected and a first control signal is supplied to a gate to which the two MOS transistors are commonly connected; at least one transistor provided between each of the word line driving element circuits and a source potential, having a capacity not lower than the electric current supplying capacity of each of the word line driving element circuits and not higher than the electric current supplying capacity of all the word line driving element circuits and whose operation is controlled by a second control signal separate from the first control signal; and a control signal generating circuit for generating the first and second control signals.

Specifically, as shown in FIG. 1, in the case of an operation performed when the source potential is supplied to all the word lines, a timing is adjusted so that the transistor is turned on after the level of the first control signal is completely switched to supply the source voltage. Thus, the two MOS transistors are prevented from being turned on at the same time and the through current can be eliminated. Further, since a quantity of electric current supplied to all the word lines is limited by the transistor, the peak current can be suppressed. Further, the variation of the source potential or an earth potential due to the generation of the through current or the peak current can be also suppressed.

Further, a semiconductor storage device according to the present invention includes a storing element part having a memory cell provided at the intersection of a word line and a bit line and a word line driving part for driving the word line in the storing element part. The word line driving part comprises: a plurality of word line driving element circuits in which one word line is connected to a drain to which two MOS transistors having different electric conductive types are commonly connected and a first control signal is supplied to a gate to which the two MOS transistors are commonly connected; at least one transistor provided between each of the word line driving element circuits and a source potential, having a capacity not lower than the electric current supplying capacity of each of the word line driving element circuits and not higher than the electric current supplying capacity of all the word line driving element circuits and whose operation is controlled by a second control signal separate from the first control signal; at least one transistor provided between each of the word line driving element circuits and an earth potential, having a capacity not lower than the electric current supplying capacity of each of the word line driving element circuits and not higher than the electric current supplying capacity of all the word line driving element circuits and whose operation is controlled by a third control signal separate from the first and second control signals; and a control signal generating circuit for generating the first, second and third control signals.

Specifically, as shown in FIG. 4, the change of voltage when the word line is set to the earth potential by a current limiting function of the transistor (the transistor located in the earth potential side) controlled by the third control signal can be loosed and the peak current can be more reduced.

Further, a semiconductor storage device according to the present invention includes a storing element part having a memory cell provided at the intersection of a word line and a bit line and a word line driving part for driving the word line in the storing element part. The word line driving part comprises: a plurality of word line driving element circuits in which drains of first and second MOS transistors of a first electric conductive type with different current supplying capacities in a source potential side are respectively commonly connected to a drain of a third MOS transistor of a second electric conductive type in an earth potential side, one word line is connected to the common connecting point and first, second and third control signals are respectively inputted to the gates of the first, second and third MOS transistors; and a control signal generating circuit for generating the first, second and third control signals. The control signal generating circuit generates the first and second control signals depending on the difference of the operation of the storing element part and switches the first and second MOS transistors.

Specifically, as shown in FIG. 6, the operations of the MOS transistors (the first and second MOS transistors in the source potential side and the third MOS transistor in the earth potential side) forming the word line driving element circuits can be respectively independently controlled. The current supplying capacity of the first MOS transistor is made different from the current supplying capacity of the second MOS transistor. For instance, at the time of a reading operation in which one word line needs to be driven at high speed, the MOS transistor having a larger capacity of electric current is employed. On the other hand, at the time of an erasing operation in which all the word lines need to be driven, a consumed power is preferentially reduced to use the MOS transistor having a lower current supplying capacity. Thus, while the high speed of the reading operation is maintained, the peak current can be more reduced.

Further, a semiconductor storage device includes a storing element part having a memory cell provided at the intersection of a word line and a bit line and a word line driving part for driving the word line in the storing element part. The word line driving part comprises: a plurality of word line driving element circuits in which the word line is connected to a drain to which two MOS transistors having different electric conductive types are commonly connected and first and second control signals different from each other are respectively inputted to the gates of the MOS transistors so that the operations of the MOS transistors can be respectively independently controlled; and a control signal generating circuit for generating the first and second control signals respectively in the word line driving element circuits. The control signal generating circuit changes the rising speed or the falling speed of the first and second control signals in accordance with the difference of the operation of the storing element part.

Specifically, as shown in FIG. 8, the operations of the two MOS transistors forming the word line driving element circuits can be respectively independently controlled. The speed (the rising speed, the falling speed) of the change of voltage of the control signals for controlling the MOS transistors is adjusted so that the potential changes of the word lines can become gentle. Thus, the peak current can be reduced especially during the erasing operation.

Further, a semiconductor storage device according to the present invention includes a storing element part having a memory cell provided at the intersection of a word line and a bit line and a word line driving part for driving the word line in the storing element part. The word line driving part comprises: a plurality of word line driving element circuits in which the word line is connected to a drain to which two MOS transistors having different electric conductive types are commonly connected and first and second control signals different from each other are respectively inputted to the gates of the MOS transistors so that the operations of the MOS transistors can be respectively independently controlled; and a control signal generating circuit for generating the first and second control signals respectively in the word line driving element circuits. The control signal generating circuit changes the potentials of the first and second control signals to intermediate potentials between a source potential and an earth potential as well as the source potential and the earth potential in accordance with the difference of the operation of the storing element part.

Specifically, as shown in FIG. 8, the operations of the two MOS transistors forming the word line driving element circuits can be respectively independently controlled. The voltage levels of the control signals for controlling the MOS transistors are adjusted so that the potential changes of the word lines can become gentle. Thus, the peak current can be reduced especially during the erasing operation.

Further, a semiconductor storage device according to the present invention includes a storing element part having a memory cell provided at the intersection of a word line and a bit line and a word line driving part for driving the word line in the storing element part. The word line driving part comprises: a plurality of word line driving element circuits in which one word line is connected to a drain to which two MOS transistors having different electric conductive types are commonly connected and a first control signal is inputted to each of the gates of the MOS transistors; at least one transistor provided between each of the word line driving element circuits and a source potential, having a capacity not lower than the electric current supplying capacity of each of the word line driving element circuits and not higher than the electric current supplying capacity of all the word line driving element circuits and whose operation is controlled by a second control signal different from the first control signals; an electric current extracting transistor that has one end connected to each of word lines driven by each of the word line driving element circuits, its electric conductive type different from that of the above-described transistor and its operation controlled by the second control signal; and a control signal generating circuit for generating the first and second signals. The control signal generating circuit allows the low-order bit of an address control signal as a base for generating the first and second control signals to correspond to the first control signal and the high-order bit thereof to correspond to the second control signal.

Specifically, as shown in FIG. 11, since the first control signal and the second control signal do not need to be separately formed, complicated control signals do not need to be used. Thus, the structure of the control signal generating circuit can be simplified. Further, the electric current extracting transistor can be provided in each word line to rapidly set the potential of the word line to the earth potential and perform a circuit operation at high speed.

According to the present invention, the generation of a through current can be prevented without deteriorating high-speed characteristics and a peak current can be reduced. Accordingly, while the high-speed characteristics during a reading operation are maintained, the through current generated when all word lines are set to a source potential is eliminated especially upon erasing operation can be removed and the peak current at that time can be likewise reduced. Accordingly, a semiconductor storage device in which the high-speed characteristics are compatible with low consumed power characteristics can be obtained.

DESCRIPTION OF THE PREFERRED EMBODIMENTS

Figure 1:
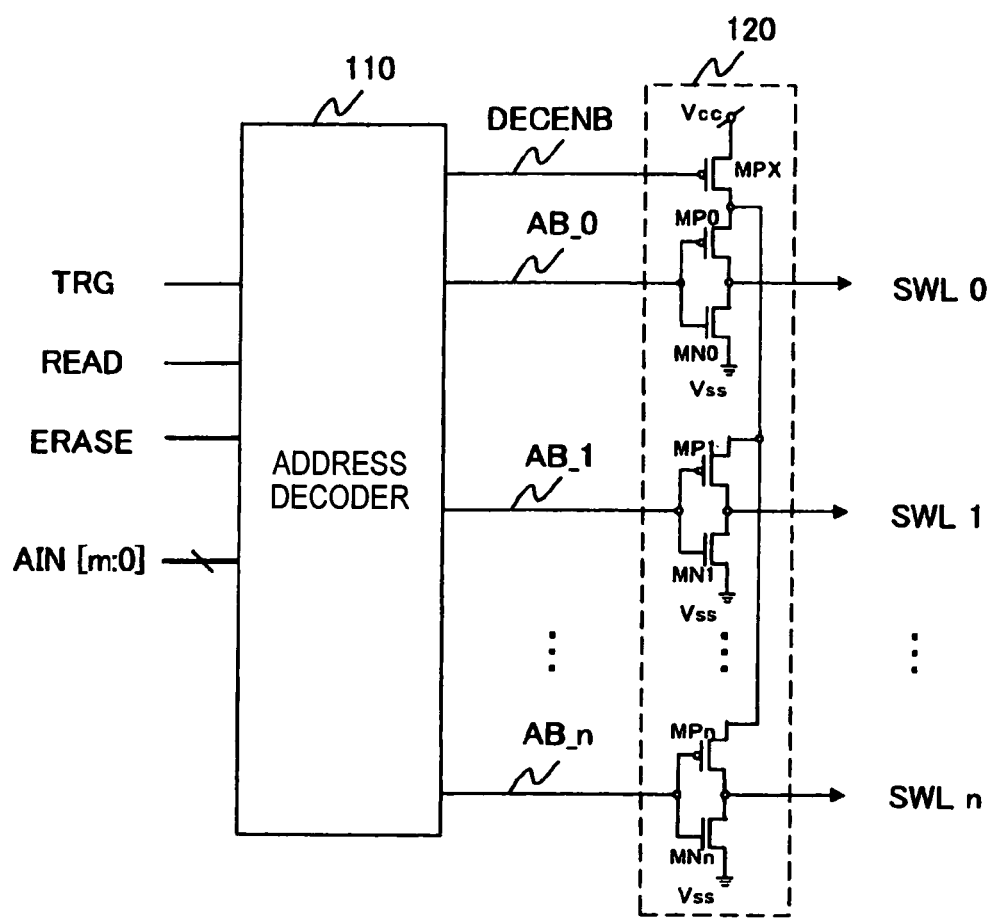
FIG. 1 is a circuit diagram showing the structure of a word line driving circuit in a semiconductor storage device according to a first embodiment of the present invention.

Now, a semiconductor storage device according to an embodiment of the present invention will be described by referring to the drawings.

First Embodiment

Figure 3:
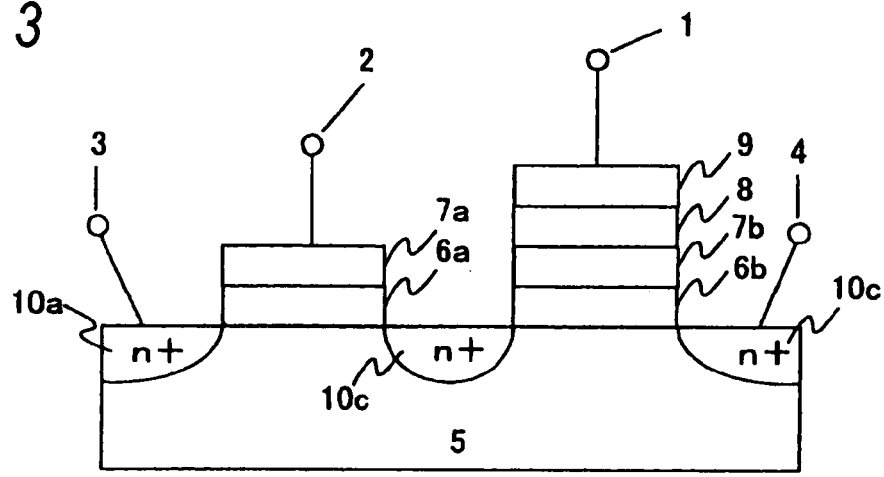
FIG. 3 is a sectional view showing the structure of a device of a memory cell (a floating gate type memory cell) of an EEPROM.

FIG. 1 is a circuit diagram showing the structure of a word line driving circuit in the semiconductor storage device according to a first embodiment. In this embodiment, a transistor having both functions for adjusting a timing and limiting an electric current is provided separately from word line driving element circuits for respectively driving word lines to prevent a through current and reduce a peak current. A semiconductor element driven by the word line driving circuit of the present invention is, for instance, an EEPROM shown in FIG. 3. Since the structure of the EEPROM is previously described, here, an explanation thereof is omitted. The word line driven by the word line driving circuit is a "selecting word line" designated by a reference numeral 2 in FIG. 3. The selecting word line 2 does not need to be especially boosted differently from a control word line 1.

In FIG. 1, to an address decoder 110, a TRG signal, a READ signal, an ERASE signal and an address signal AIN[m:0] are inputted and these signals are decoded to form control signals (DECENB, AB-0 to AB-n). The address decoder 110 raises each word line of an address designated by the address signal AIN[m:0]. The READ signal is a signal for selecting an input signal during a reading operation. The ERASE signal is a signal for controlling the input signal during an erasing operation. The TRG signal is an operation start signal to perform the reading operation or the erasing operation by receiving the rise of the TRG signal.

A word line driving part 120 receives each of the control signals (AB-0 to AB-n) from the address decoder 110 to drive the word lines corresponding to each operation mode. The word line driving part 120 includes a plurality of word line driving element circuits composed of CMOS inverter drivers (formed by respectively commonly connecting gates and drains of Pch MOS transistors MP0 to MPn and Nch MOS transistors MN0 to MNn) respectively provided correspondingly to word lines (SWL0 to SWLn).

In the word line driving circuit shown in FIG. 1, a Pch MOS transistor (refer it simply to as a Pch transistor, hereinafter) MPX having both the functions for adjusting a timing and limiting an electric current is provided separately from the word line driving element circuits for driving each of the word lines.

The Pch transistor MPX is a transistor connected to the source potential side of the Pch transistors (MP0 to MPn) respectively forming the word line driving element circuits. The electric current supplying capacity of the Pch transistor MPX is not lower than the electric current supplying capacity of one word line driving element circuit and not higher than the total electric current supplying capacity of all the word line driving element circuits. Here, the electric current supplying capacity of the Pch transistor MPX is relatively lower than the total electric current supplying capacity of all the word line driving element circuits. Thus, when all the word lines (SWL0 to SWLn) are selected, a quantity of electric current is restricted. The Pch transistor MPX is controlled by the DECENB signal outputted from the address decoder 110. In the present invention, the Pch transistors and the Nch transistors are employed. However, when the same effects can be obtained, the transistors are not especially limited to specific types.

Figure 2:
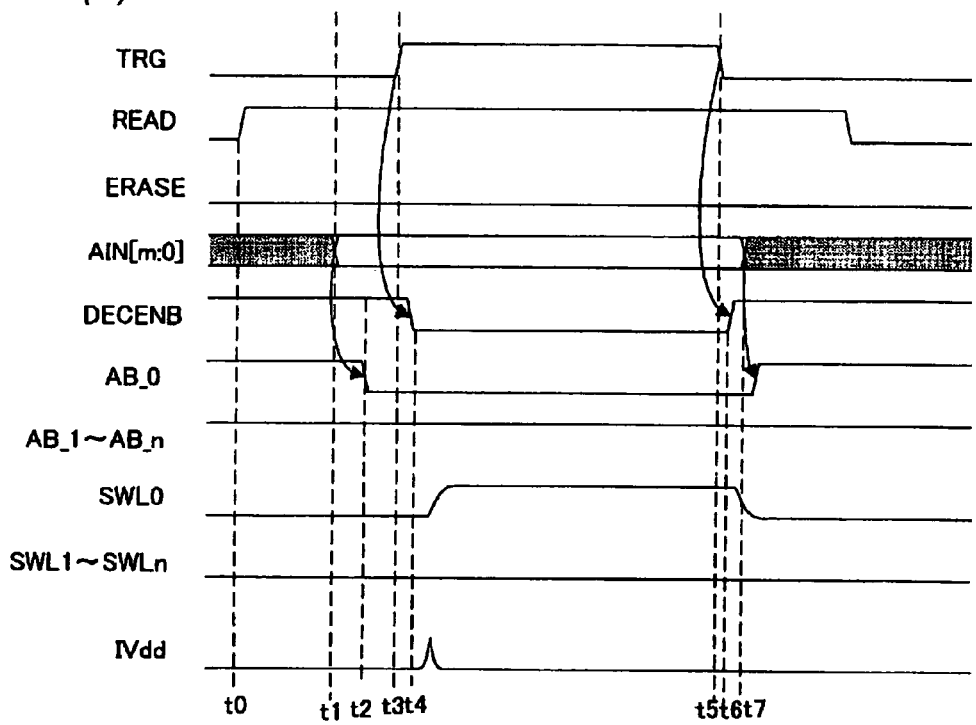
FIG. 2(a) is a timing chart for explaining an operation of the word line driving circuit shown in FIG. 1 in a reading mode and FIG. 2(b) is a timing chart for explaining the operation of the word line driving circuit shown in FIG. 1 in an erasing mode.
Figure 2:
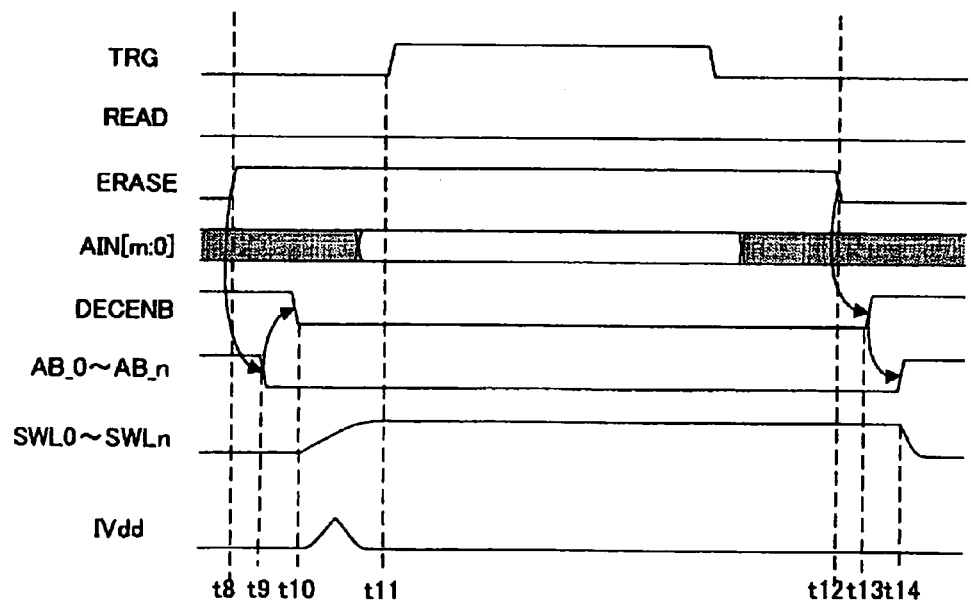

Now, an operation of the word line driving circuit shown in FIG. 1 will be described by referring to a timing chart of FIG. 2. FIG. 2(a) is a timing chart during the reading operation of the word line driving circuit. When the reading operation is carried out, the READ signal is firstly inputted to the address decoder 110 (time t0). Then, the address signal AIN[m:0] for designating an address to be read is inputted (time t1).

When the address signal AIN[m:0] is received, the control signals AB-0 to AB-n (namely, one of them) corresponding to the word lines to be selected (SWL0 to SWLn) shift from H to L (time t2). In FIG. 2(a), to designate the word line (SWL0), the control signal AB-0 shifts from H to L. At this time, since the control signal DECENB inputted to the Pch transistor MPX is located at H, a source potential Vcc is not supplied to the selected word line SWL0.

Then, the TRG signal as the operation start signal shifts from L to H (time t3), so that the DECENB signal shifts from H to L (time t4) and the source potential Vcc is supplied to the word line SWL0. From this time, the reading operation is started.

Usually, at this time, a through current is supplied to the PCh transistor MP0 and the Nch transistor MN0. However, in this embodiment, the reading operation is started after the control signal AB-0 completely shifts from H to L (that is, after the Nch transistor MN0 is already turned off). Accordingly, the through current is not supplied. Therefore, an electric current supplied from the Pch transistor MPX is completely supplied to the word line SWL0.

Further, when the reading operation is completed to shift the TRG signal from H to L (time t5), the DECENB signal shifts from L to H (time t6). After that, the control signal AB-0 rises to an H level (time t7). Then, the source potential (Vcc) of the word line SWL0 shifts to an earth potential Vss.

Also at this time, the DECENB signal shifts from L to H, the supply of the source voltage from the Pch transistor MPX is stopped, and then, the control signal AB-0 rises to the H level. Accordingly, the transistors MP0 and MN0 are not turned on at the same time and the through current does not flow. Therefore, the semiconductor storage device (the word line driving circuit) excellent in its low consumed current characteristics is realized. Further, since the electric current supplying capacity of the Pch transistor MPX is sufficient for driving one word line, the high-speed characteristics of the reading operation are maintained as they are.

FIG. 2(b) is a timing chart of an erasing operation. When the erasing operation is carried out, the ERASE signal is firstly inputted to the address decoder 110 (time t8). When the ERASE signal is received, all the control signals (AB-0 to AB-n) shift from H to L (time t9). Then, the DECENB signal as the control signal of the Pch transistor MPX shifts from H to L (time t10).

The DECENB signal shifts from H to L, so that the source voltage is supplied to all the word lines (SWL0 to SWLn). At this time, the Nch transistor in each word line driving element circuit is already turned off at the time of t9. Accordingly, the through current is not supplied between the source potential Vcc and the earth potential Vss.

Further, since the electric current supplying capacity of the Pch transistor MPX is, for instance, substantially the same as the electric current supplying capacity of the Pch transistor (MP0 to MPn) in each word line driving element circuit, an electric current is limited. As a result, all the word lines (SWL0 to SWLn) slowly shift to the source potential Vcc. Accordingly, a large quantity of transient current Ivdd does not flow and the peak current can be reduced.

Further, when the erasing operation is completed, the ERASE signal shifts from H to L (time t12), the DECENB signal shifts from L to H (time t13), and then, the potential of all the word lines (SWL0 to SWLn) is dropped from the source potential Vcc to the earth potential Vss (time t14) by all the word line driving element circuits.

As described above, the through current does not flow between the Pch transistor and the Nch transistor in each of the word line driving element circuits. Further, the peak current can be reduced so that the semiconductor storage device (the word line driving circuit) excellent in its low consumed power characteristics can be realized.

Second Embodiment

Figure 4:
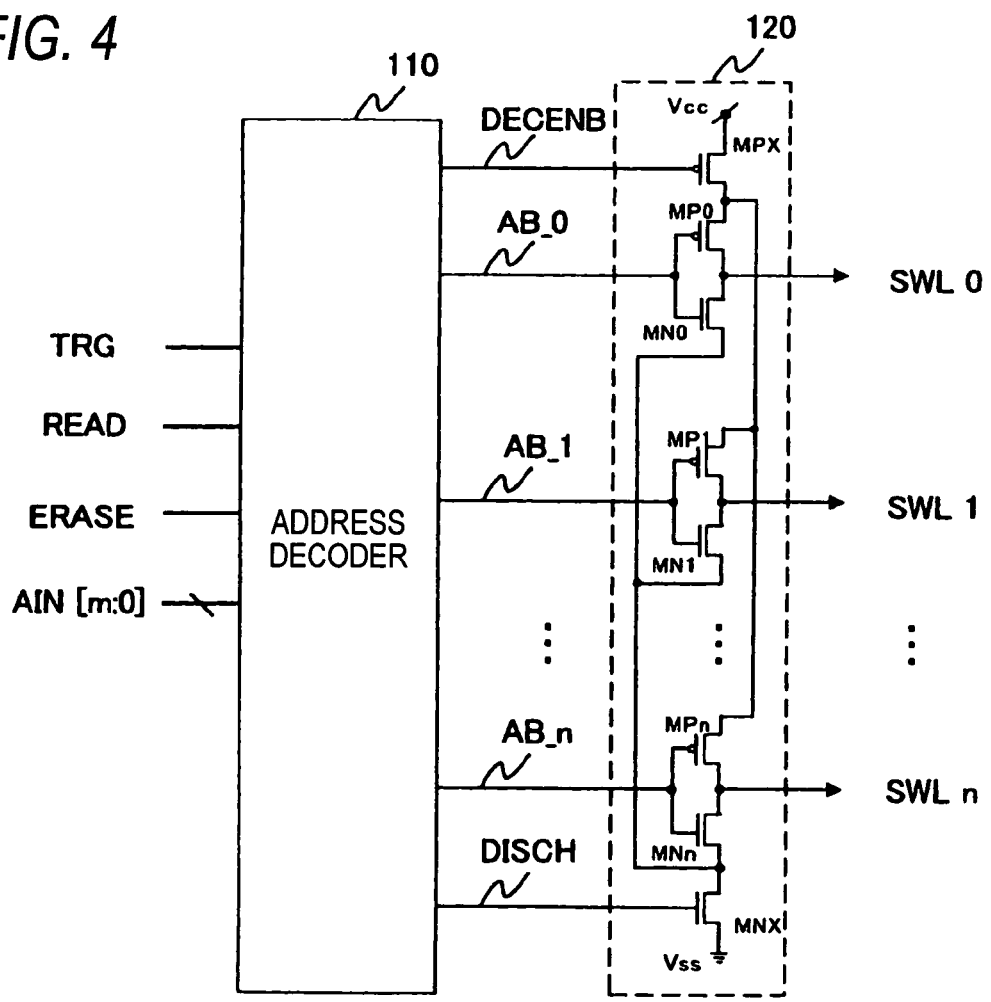
FIG. 4 is a circuit diagram showing the structure of a word line driving circuit in a semiconductor storage device according to a second embodiment of the present invention.
Figure 5:
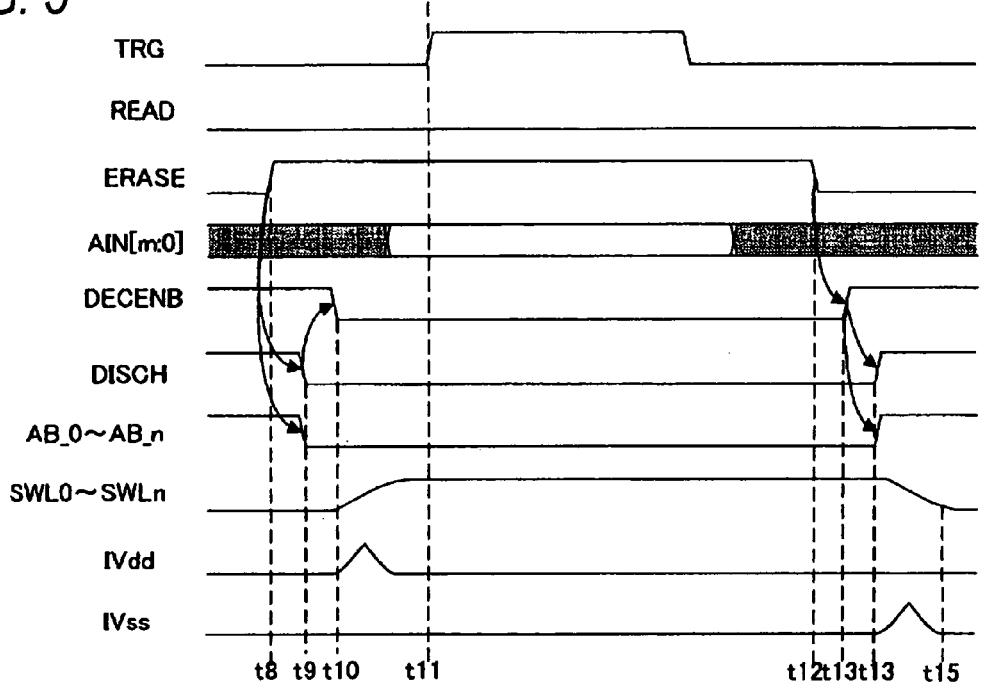
FIG. 5 is a timing chart for explaining an operation of the word line driving circuit shown in FIG. 4 in an erasing mode.

With reference to FIGS. 4 and 5, the structure and operation of a word line driving circuit in a semiconductor device of this embodiment will be described. In FIG. 4, parts having the same functions as those of the circuit shown in FIG. 1 are designated by the same reference numerals and described.

The basic structure of the word line driving circuit of this embodiment is the same as that of the circuit shown in FIG. 1. However, in FIG. 4, differently from the circuit shown in FIG. 1, an Nch transistor MNX for limiting an electric current is likewise provided in an earth potential side. Thus, a potential change becomes gentle until the potential of a word line returns to an earth potential Vss, so that a peak current can be more reduced. That is, in FIG. 4, one or more Nch transistors (MNX) are provided respectively in the earth terminal side of the Nch transistors (MN0 to MNn) of a plurality of word line driving element circuits.

The electric current supplying capacity of the Nch transistor (MNX) is set to a capacity not lower than the electric current supplying capacity of the Nch transistor (MN0 to MNn) in one word line driving element circuit and not higher than the total electric current supplying capacity of all the word line driving element circuits. The Nch transistor (MNX) is controlled by a DISCH signal from an address decoder 110. In this embodiment, the Pch transistors and the Nch transistors are used and described. However, when the same effects can be achieved, the kinds of the transistors are not especially limited to specific types.

Now, the operation of the circuit shown in FIG. 4 will be described by referring to a timing chart shown in FIG. 5. FIG. 5 shows the timing chart when an erasing operation is carried out. Since the operation of the circuit during a reading operation is the same as that of the above-described embodiment, an explanation thereof is omitted.

When the erasing operation is carried out, an ERASE signal is firstly inputted (time t8) and the DISCH signal shifts from H to L (time t9) at the same timing as that when all control signals (AB-0 to AB-n) shift from H to L. Then, a DECENB signal changes from H to L (time t10). A through current Ivdd is not generated like the first embodiment. Further, when the erasing operation is completed, the ERASE signal shifts from H to L (time t12). Then, the DECENB signal shifts from L to H (time t13). After that, the DISCH signal and the control signals (AB-0 to AB-n) shift from L to H (time t14).

Thus, the potential of all word lines (SWL0 to SWLn) is dropped to the earth potential Vss from a source potential. However, at this time, since the electric current supplying capacity of the Nch transistor (MNX) is low, the potential of all the word lines is slowly dropped to the earth potential Vss (time t14 to t15). Accordingly, not only the through current Ivss can be prevented, but also the peak current can be reduced. Thus, the stable semiconductor storage device (the word line driving circuit) in which the peak current and consumed current are more reduced can be provided.

Third Embodiment

This embodiment is different from the first and second embodiments and the operations of transistors themselves forming word line driving element circuits for driving word lines can be independently controlled. Two transistors having different current supplying capacities are provided as transistors in a source potential side (a power source side) are provided. These transistors are properly switched and used to prevent a through current and reduce a peak current.

Figure 6:
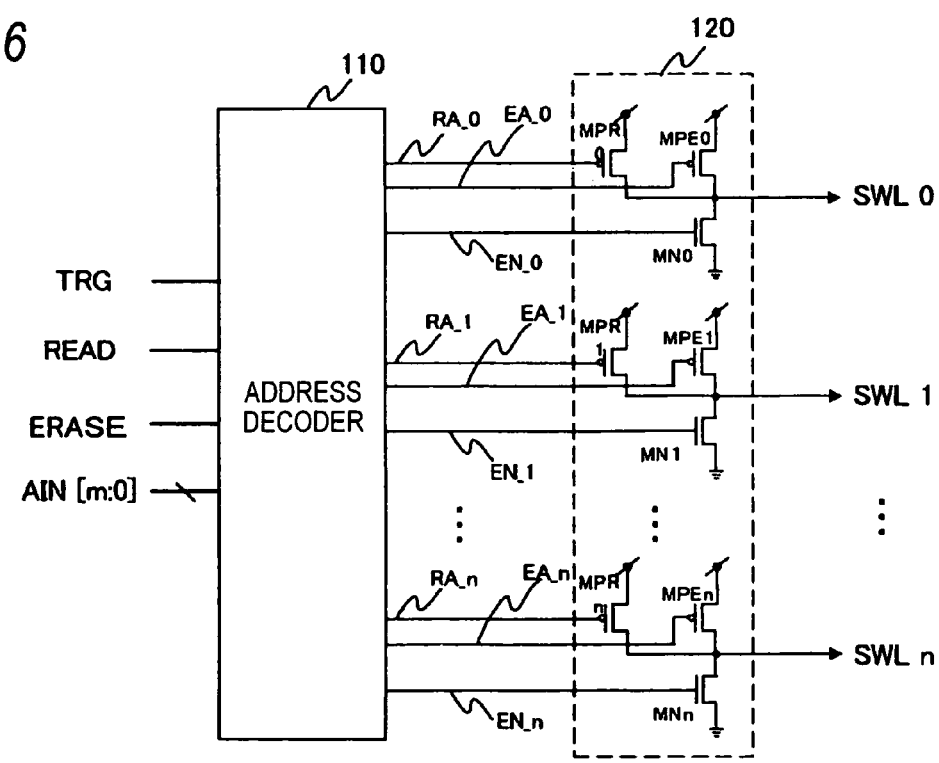
FIG. 6 is a circuit diagram showing the structure of a word line driving circuit in a semiconductor storage device according to a third embodiment of the present invention.

As shown in FIG. 6, one word line driving element circuit in a word line driving circuit 120 includes two Pch transistors (MPR0, MPE0, etc.) having the different electric current supplying capacities and one Nch transistor (MN0, etc.) whose drains are commonly connected together. Accordingly, the word line driving element circuit of this embodiment is a CMOS push-pull driver. To the gates of the three transistors, independent control signals (RA-0, EA-0, EN0, etc.) are respectively inputted. Thus, the operations of the transistors can be respectively independently controlled.

Here, the size of the transistor (MPR0, etc.) in the left side of the two Pch transistors (MPR0, MPE0, etc.) is larger than that of the other and the electric current supplying capacity thereof is higher than that of the other. The transistor having the high electric current supplying capacity is used during a reading operation. The transistor having the low electric current supplying capacity is used during an erasing operation.

Figure 7:
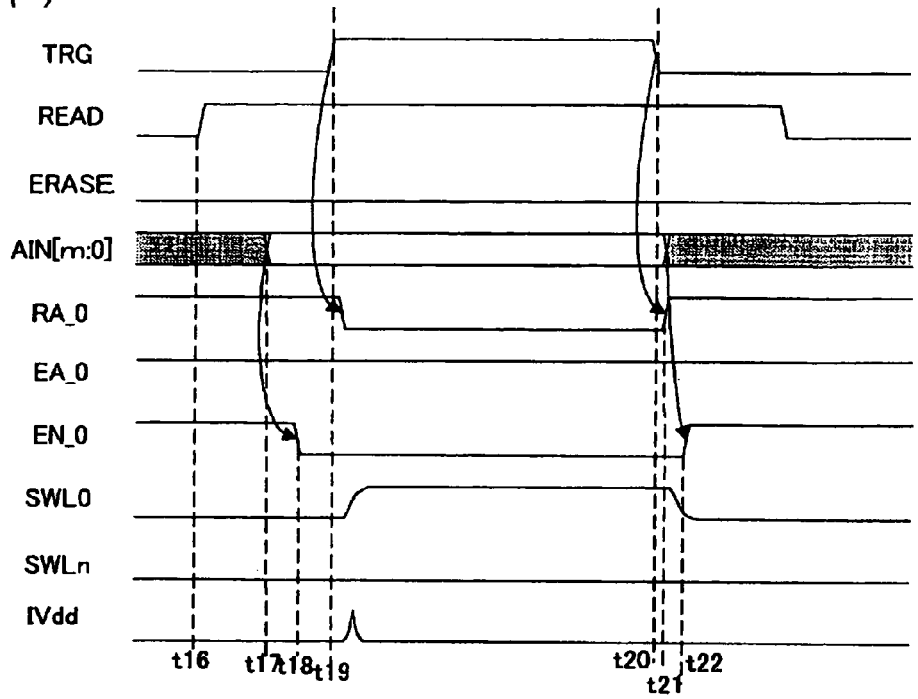
FIG. 7(a) is a timing chart for explaining an operation of the word line driving circuit shown in FIG. 6 in a reading mode and FIG. 7(b) is a timing chart for explaining the operation of the word line driving circuit shown in FIG. 6 in an erasing mode.
Figure 7:
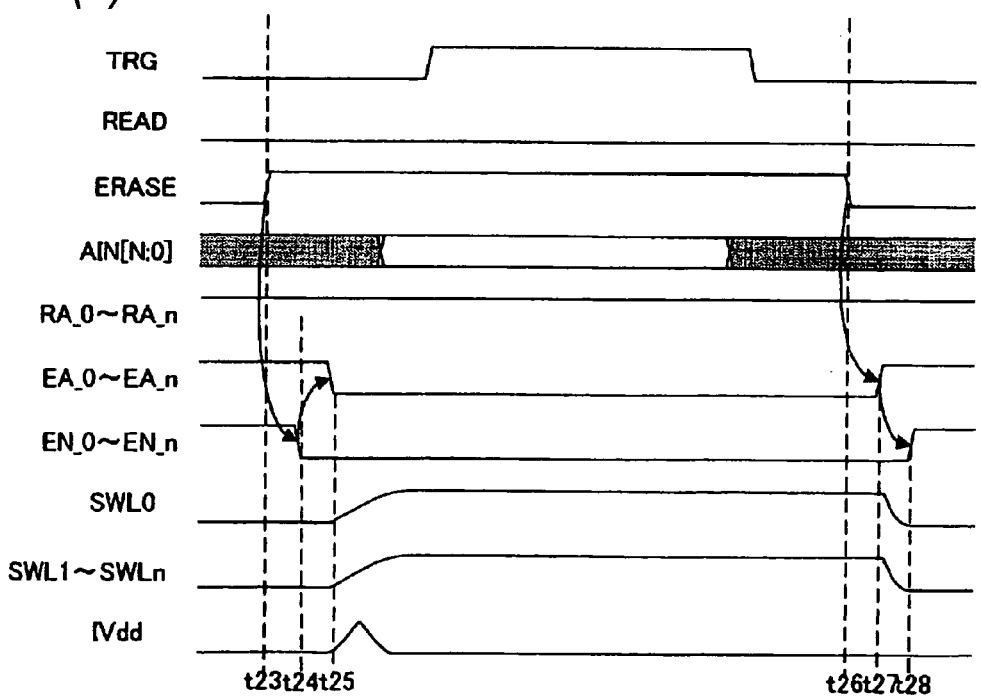

Now, the operation of the circuit having the above-described structure will be described below. FIG. 7(a) is a timing chart during the reading operation. When the reading operation is carried out, a READ signal is firstly inputted to an address decoder 110 (time t16). Then, an address signal AIN[m:0] for designating an address to be read is inputted (time t17). Here, assuming that a word line SWL0 is selected, an explanation will be given. When the address signal AIN[m:0] is received, the address decoder 110 shifts the Nch transistor (EN-0) corresponding to the selected address from H to L (time t18).

Then, an operation start signal TRG shifts from L to H (time t19), so that the reading operation is started. The control signal RA-0 is shifted from H to L and a source potential Vcc is supplied to the word line (SWL0) through the transistor having the high electric current supplying capacity.

At this time, control signals (RA-1 to RA-n, EA1 to EA-n) corresponding to other word lines and the control signal EA0 of the Pch transistor MPE0 having the low electric current supplying capacity and corresponding to the word line SWL0 are fixed to H.

Further, at time t20, the TRG signal changes from H to L, and the RA-0 signal changes from L to H (thus, the Pch transistor MPR0 is turned off). After that, EN-0 changes from L to H (time t22).

As described above, when the reading operation is started, after the Nch transistor (MN0) is turned off, the Pch transistor (MPR0) having the high electric current Ivdd supplying capacity is turned on. Thus, the through current is not generated. Further, when the reading operation is completed, after the Pch transistor (MPR0) is turned off, the Nch transistor (MN0) is turned on. Thus, the through current is not likewise generated. Further, since the transistor having the higher electric current supplying capacity of the two Pch transistors prepared in parallel drives the word line, the high speed characteristics of the reading operation can be maintained.

FIG. 7(b) is a timing chart during the erasing operation. When the erasing operation is started, an ERASE signal is firstly inputted to the address decoder 110 (time t23). All control signals (EN-0 to EN-n) shift from H to L (time t24). Then, all signals (EA-0 to EA-n) for controlling the Pch transistor having the low electric current supplying capacity shift from H to L (time t25). Thus, the potential of all word lines rises to the source potential Vcc. When the erasing operation is completed, the ERASE signal falls (time t26). All the control signals (EA-0 to EA-n) shift from L to H (time t27). After that, all the control signals (EN-0 to EN-n) shift from L to H (time t28).

As described above, operation timing is shifted so that the Pch transistor and the Nch transistor are not turned on at the same time. Thus, the through current does not flow. Further, when all the word lines are set to the source potential Vcc, since the Pch transistor having the low electric current supplying capacity (MPE0,etc.) is used, a total quantity of electric current Ivdd is reduced to suppress the peak current. Here, the Pch transistors and the Nch transistor are employed and described. However, when the same effects can be obtained, the kinds of the transistors are not especially limited to specific types.

Fourth Embodiment

In the third embodiment, the two Pch transistors having the different electric current supplying capacities are switched and used to change the electric current supplying capacity. However, in this embodiment, the rate of change (speed of change) of the control voltage of one Pch transistor is varied to suitably change the electric current supplying capacity of the transistor and reduce a peak current especially during an erasing operation. The two transistors are prevented from being turned on at the same time to prevent a through current from being generated like the above-described embodiment.

Figure 8:
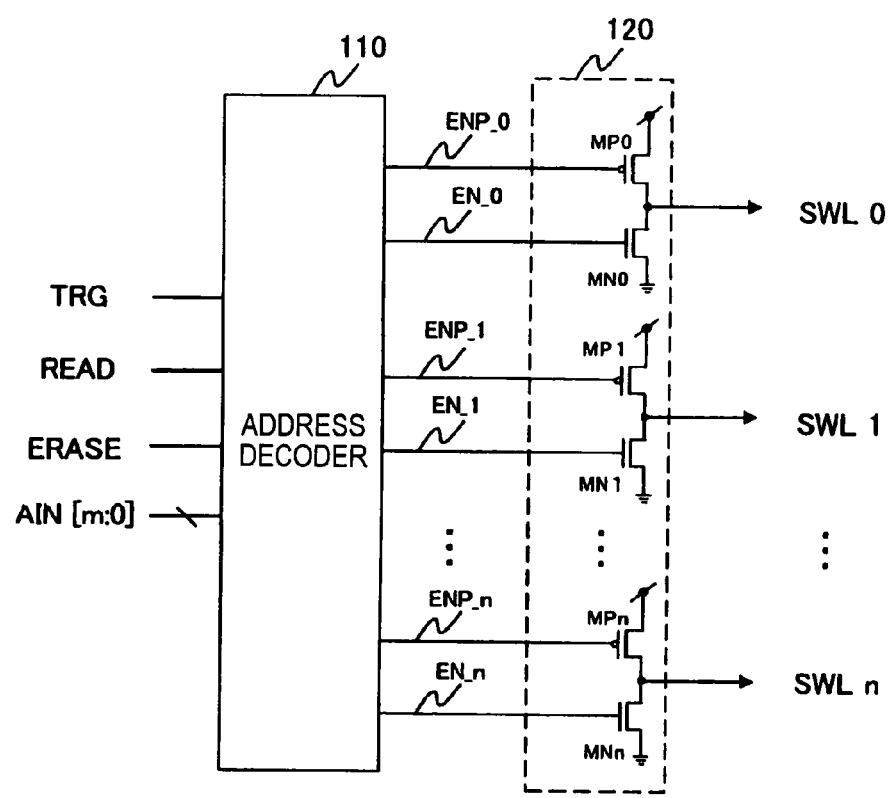
FIG. 8 is a circuit diagram showing the structure of a word line driving circuit in a semiconductor storage device according to a fourth embodiment of the present invention.

FIG. 8 is a circuit diagram showing the structure of a word line driving circuit in a semiconductor storage device according to this embodiment. As shown in FIG. 8, a word line driving element circuit for driving one word line comprises a Pch transistor (MP0, etc.) and an Nch transistor (MN0, etc), drains of the transistors are respectively commonly connected and a word line (SWL0, etc.) is connected to the common connecting point thereof. To the gates of the transistors (MP0 or MN0, etc.), independent control signals (ENP-0 or EN-0, etc.) are respectively inputted.

Figure 9:
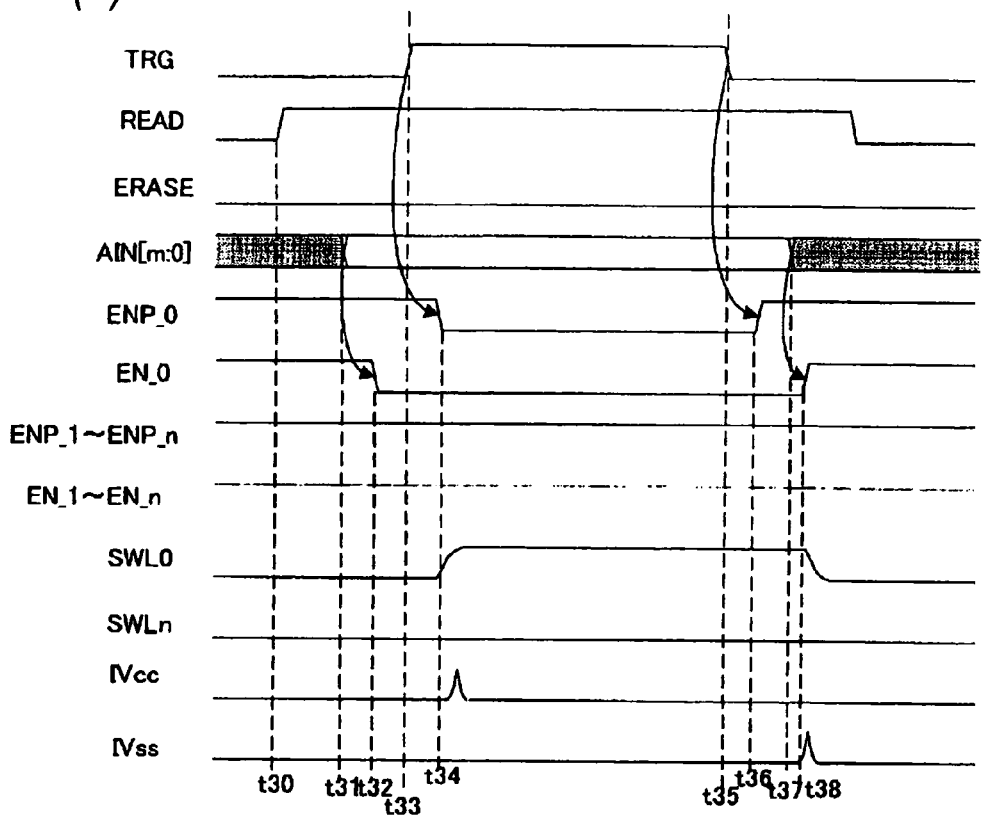
FIG. 9(a) is a timing chart for explaining an operation of the word line driving circuit shown in FIG. 8 in a reading mode and FIG. 9(b) is a timing chart for explaining the operation of the word line driving circuit shown in FIG. 8 in an erasing mode.
Figure 9:
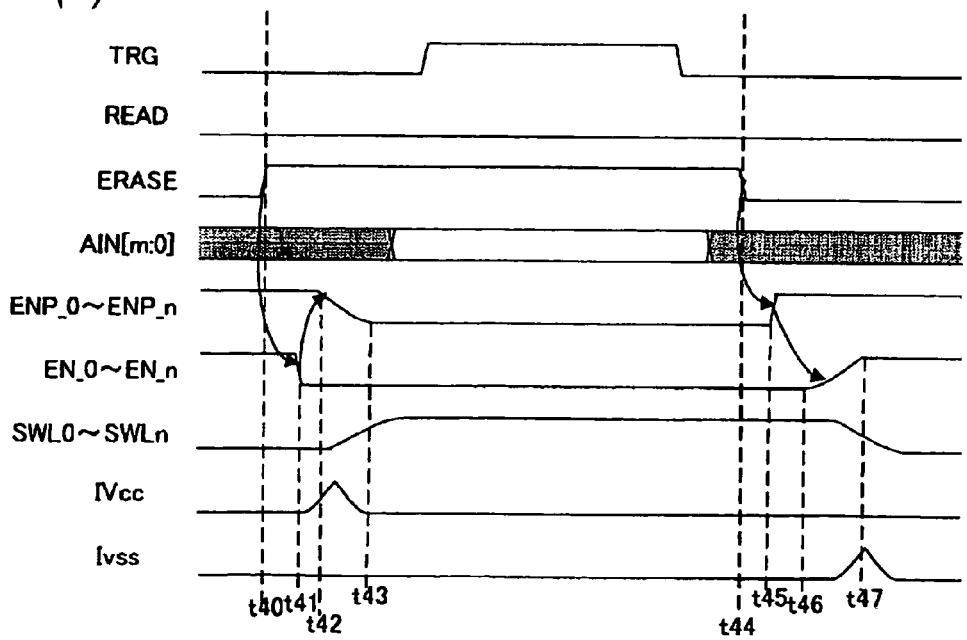

FIG. 9(a) is a timing chart during a reading operation. When the reading operation is carried out, a READ signal is firstly inputted to an address decoder 110 (time t3016). Then, an address signal AIN[m:0] for designating an address to be read is inputted (time t31). Here, assuming that the word line SWL0 is selected, an explanation will be given.

When the address signal AIN[m:0] is received, the address decoder 110 shifts a control signal (EN-0) to the Nch transistor corresponding to the selected address from H to L (time t32). Thus, the Nch transistor (MN0) is turned off.

Then, a TRG signal showing the start of an operation shifts from L to H (time t33), so that the reading operation is started. A control signal (ENP-0) is shifted from H to L (time t34) so that the Pch transistor (MP0) is turned on and a source potential Vcc is supplied to the word line (SWL0).

At this time, EN-1 to EN-n, and ENP1 to ENP-n of other word line driving circuits 120 are fixed to H. The Pch transistor (MP0) is opened after the Nch transistor (MN0) is closed in the same manner as that of the above-described embodiment, so that the through current is not generated.

FIG. 9(b) is a timing chart during the erasing operation. When the erasing operation is carried out, an ERASE signal is firstly inputted to an address decoder 110 (time t40). All the control signals (EN-0 to EN-n) shift from H to L (time t41). Then, the signals (ENP-0 to ENP-n) for controlling the Pch transistor slowly shift from H to L (time t42 to time t43).

At this time, since the change of voltage of the control signals is gentle, the Pch transistors (MP0 to MPn) respectively gradually supply an electric current Ivcc to all word lines (SWL0 to SWLn). Thus, all the word lines slowly rise to the source potential Vcc. Accordingly, a large quantity of transient current does not flow so that the peak current can be suppressed. The Pch transistor and the Nch transistor are prohibited from being turned on at the same time and the through current is not generated like the above-described embodiment.

Further, when the erasing operation is completed, the ERASE signal falls from H to L (time t44), and the control signals (ENP-0 to ENP-n) of the Pch transistors shift from L to H (time t45). After that, the control signals (EN-0 to EN-n) of the Nch transistors slowly shift from L to H (time t46 to time t47). Thus, a large quantity of transient current does not flow to reduce the peak current. Further, since the Pch transistor and the Nch transistor are prohibited from being turned on at the same time, the through current Ivss is not generated like the above-described embodiment. Here, the Pch transistor and the Nch transistor are employed. However, when the same effects are obtained, the kinds of the transistors are not particularly limited to specific types.

As described above, the rate of change (speed of change) of the control voltage of one Pch transistor is varied and the electric current supplying capacity of the transistor is suitably changed so that the peak current can be reduced especially during the erasing operation.

Fifth Embodiment

The structure of a word line driving circuit of this embodiment is the same as that of the fourth embodiment (FIG. 8). In the fourth embodiment, the speed of the change of voltage of the control signal is adjusted to reduce the peak current. On the other hand, in this embodiment, the voltage level of a control signal is adjusted to obtain an effect of reducing the peak current.

Figure 10:
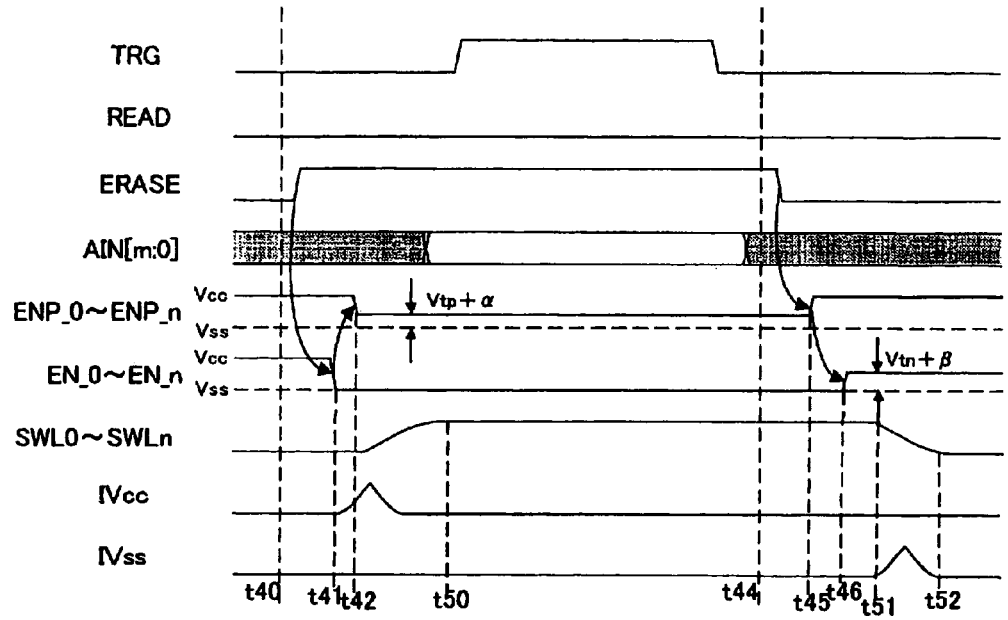
FIG. 10 is a timing chart for explaining the operation of a word line driving circuit during an erasing mode in a semiconductor storage device according to a fifth embodiment of the present invention.

FIG. 10 is a timing chart during an erasing operation. During the erasing operation, an ERASE signal is firstly inputted to an address decoder 110 (time t40) and all control signals (En-0 to EN-n) of Nch transistors shift from H to L (time t41). Then, the control signals (ENP-0 to ENP-n) of Pch transistors are set to an intermediate potential (here, voltage obtained by adding prescribed voltage a to the threshold value Vtp of the Pch transistor) between a source potential (Vcc) and an earth potential (vss) (time t42).

When the intermediate potential is supplied, the electric current supplying capacities of the Pch transistors (MP0 to MPn) are respectively lowered to slowly supply an electric current to word lines. Accordingly, potentials of the word lines (SWL0 to SWLn) gently rise (time t42 to time t50). Thus, a large quantity of transient current Ivcc is not generated. Therefore, when the word lines are set to the source potential Vcc, the peak current can be reduced.

Further, when the erasing operation is completed likewise, the ERASE signal falls (time t44) to shift the potentials of the control signals (ENP-0 to ENP-n) of the Pch transistors from Vtp+α to the source potential Vcc (time t45). After that, the potentials of the control signals (EN-0 to EN-n) of the Nch transistors are set to an intermediate potential (here, a potential obtained by adding prescribed voltage β to the threshold value Vtn of the Nch transistor) between the earth potential Vss and the source potential Vcc (time t46).

Thus, the electric current supplying capacities of the Nch transistors (MN0 to MNn) are restricted and the potentials of the word lines (SWL0 to SWln) respectively slowly fall (time t51 to time t52). Accordingly, a large quantity of transient current Ivss does not flow to reduce the peak current. Further, a through current can be prevented from being generated like the above-described embodiment. Here, the Pch transistors and the Nch transistors are employed. However, if the same effects can be obtained, the kinds of the transistors may not be especially limited specific types.

Sixth Embodiment

In this embodiment, a transistor having a timing adjusting function or an electric current limiting function is provided separately from a word line driving element circuit like the word line driving circuit shown in FIG. 1. Further, when a first control signal (for controlling the above-described transistor) and a second control signal (for controlling each transistor forming the word line driving element circuit) are formed in an address decoder, the high-order bit of an address control signal (a control signal formed in the address decoder on the basis of which the first and second control signals are formed) is allowed to correspond to the first control signal and the low-order bit of the address control signal is allowed to the second control signal.

Thus, when any of the transistors forming the word line driving element circuits is driven by the second control signal, the first control signal for controlling the transistor having the timing adjusting function or the electric current limiting function corresponding to the transistors is also always outputted. Accordingly, a complicated control signal (a timing signal or the like) does not need to be formed and the structure of the address decoder (a control signal generating circuit) can be simplified. Further, an electric current extracting transistor is provided in each word line to accelerate speed for shifting the word line to an earth potential. Thus, a circuit operation can be performed at high speed.

Figure 11:
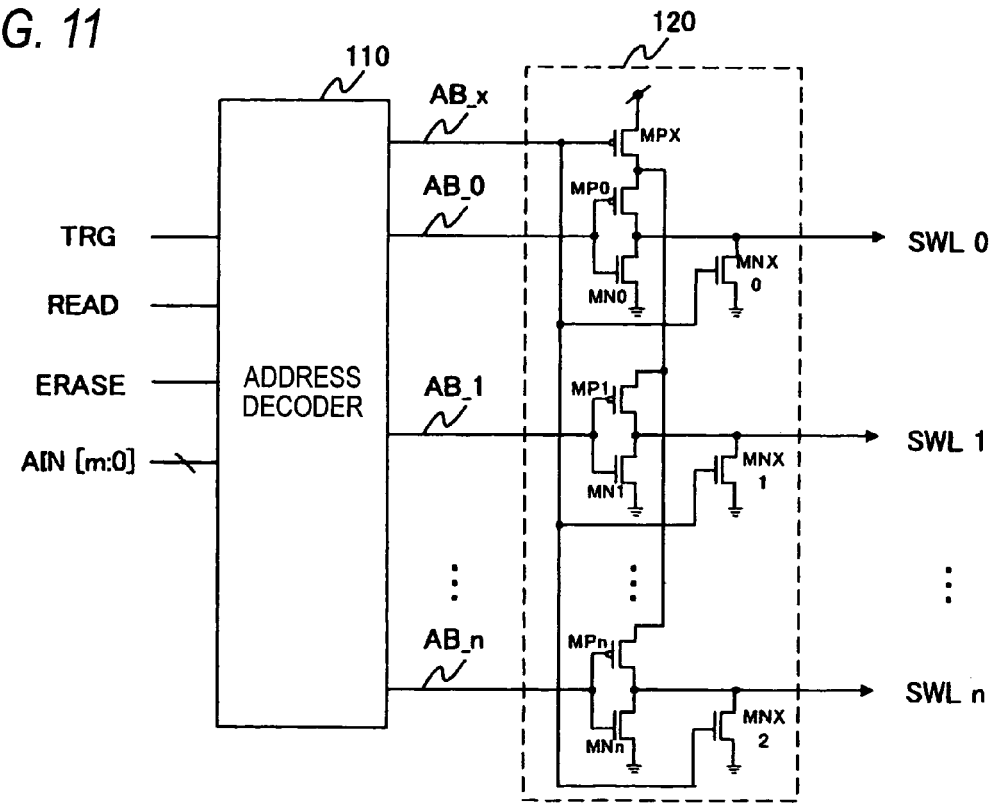
FIG. 11 is a circuit diagram showing the structure of a word line driving circuit in a semiconductor storage device according to a sixth embodiment of the present invention.

FIG. 11 is a circuit diagram showing the structure of a word line driving circuit according to this embodiment. In FIG. 11, a word line driving circuit 120 receives the control signals (AB-x and AB-0 to AB-n) from the address decoder 110 to drive the word lines (SWL0 to SWLn) respectively corresponding operation modes.

The word line driving part 120 includes the word line driving element circuits (formed by respectively commonly connecting the gates and drains of Pch MOS transistors MP0 to MPn to those of Nch MOS transistors MN0 to MNn) which are provided respectively correspondingly to the word lines (SWL0 to SWLn). The operations of the word line driving element circuits are respectively controlled by the control signals (AB-0 to AB-n).

In the word line driving circuit 120 shown in FIG. 11, the Pch transistor MPX having both the functions of adjusting the timing and the limiting the electric current is provided separately from the word line driving element circuits respectively for driving the word lines. The Pch transistor MPX is a transistor connected to a source potential side of the Pch transistor (MP0 to MPn) forming each of the word line driving element circuits. The electric current supplying capacity of the Pch transistor MPX is not lower than the electric current supplying capacity of one word line driving element circuit and not higher than the total electric current supplying capacity of all the word line driving element circuits. Here, the electric current supplying capacity of the Pch transistor MPX is relatively lower than the total electric current supplying capacity of all the word line driving element circuits. Thus, when all the word lines (SWL0 to SWLn) are selected, the electric current is limited. The Pch transistor MPX is controlled by the first control signal AB-x outputted from the address decoder 110.

The first control signal AB-x corresponds to the high-order bit of the address control signal formed in the address decoder 110. Further, the second control signals (AB-0 to AB-n) for controlling the transistors respectively forming the word line driving element circuits are signals corresponding to the low-order bit of the address control signal.

In addition to the above-described structure, in the word line driving part 120 shown in FIG. 11, the electric current extracting Nch transistors (MNX0 to MNX2) are respectively connected to the word lines (SWL0 to SWLn). The operations of the Nch transistors (MNX0 to MNX2) are also controlled by the first control signal AB-x (a high-order signal of the second control signals AB-0 to AB-n). Here, the Pch transistor and the Nch transistors are employed. However, when the same effects can be obtained, the kinds of the transistors are not especially limited to specific types.

Figure 12:
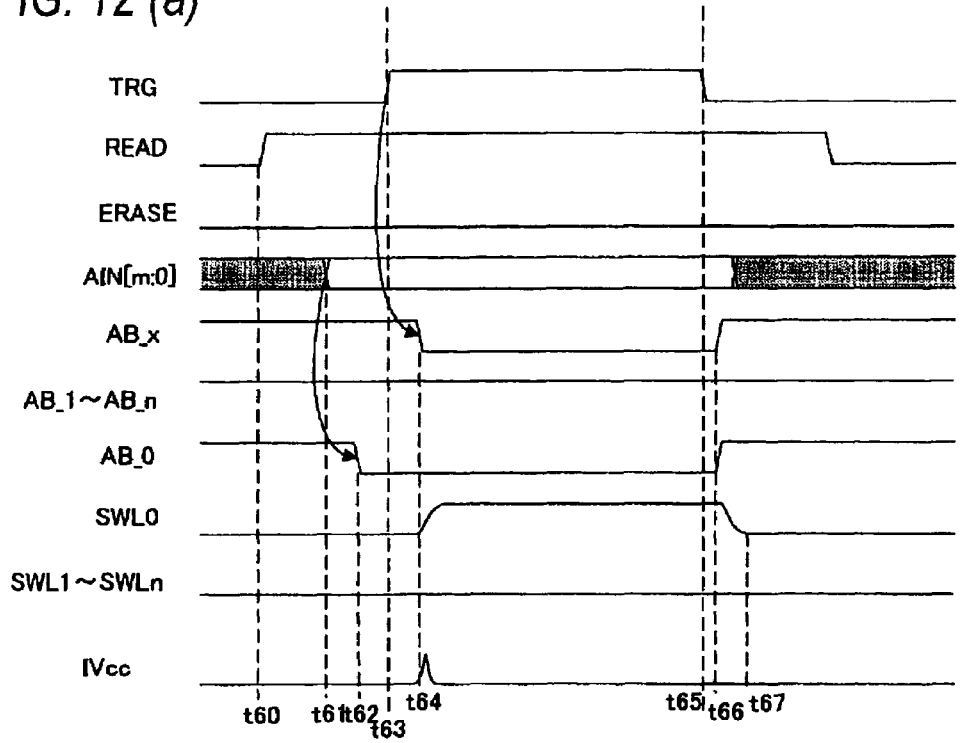
FIG. 12(a) is a timing chart for explaining an operation of the word line driving circuit shown in FIG. 11 in a reading mode and FIG. 12(b) is a timing chart for explaining the operation of the word line driving circuit shown in FIG. 11 in an erasing mode.
Figure 12:
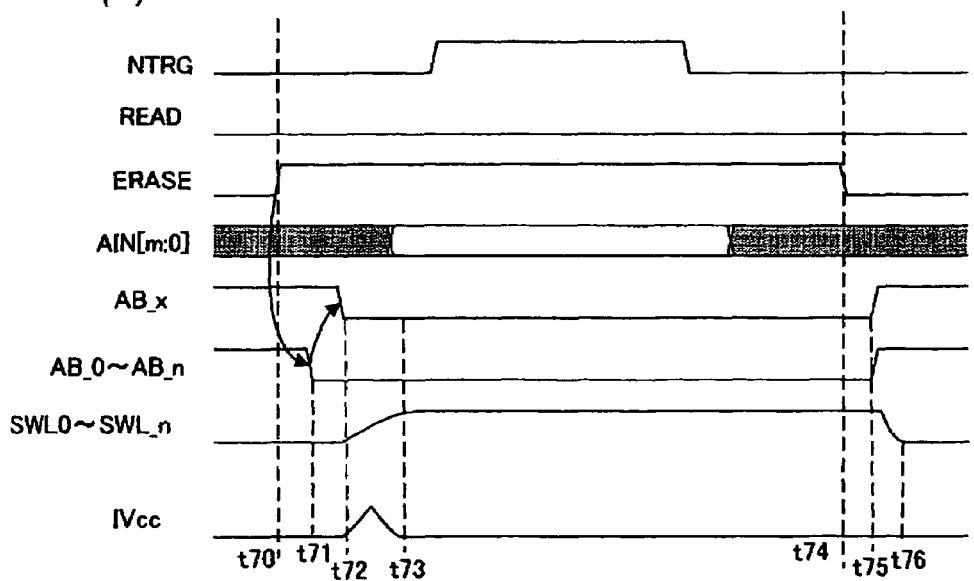
Figure 13:
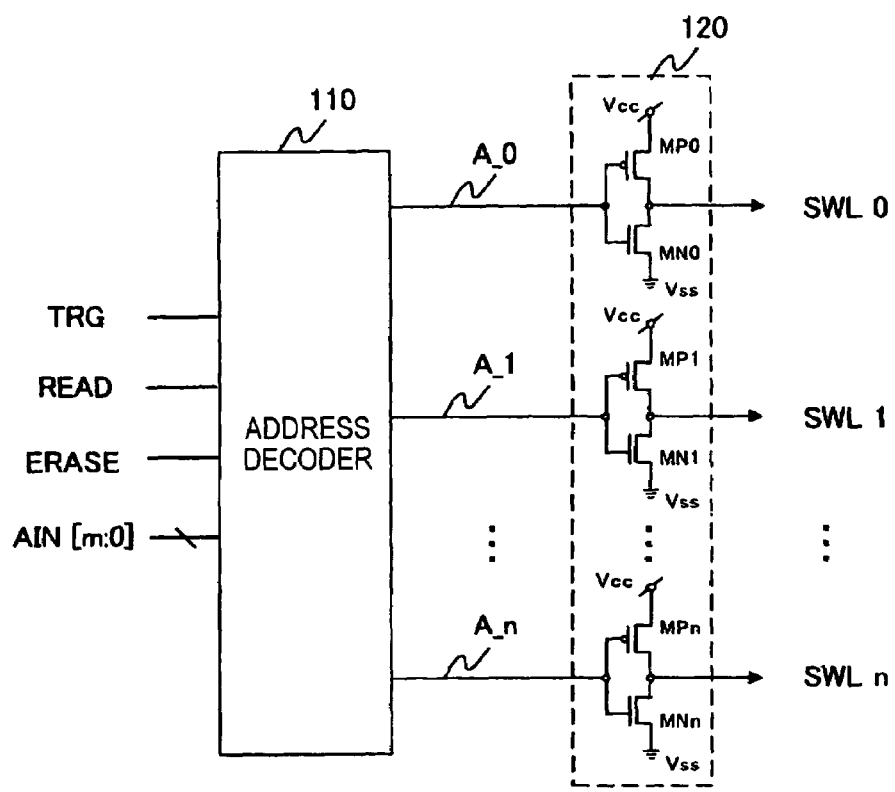
FIG. 13 is a circuit diagram showing the structure one example of a usual word line driving circuit.
Figure 14:
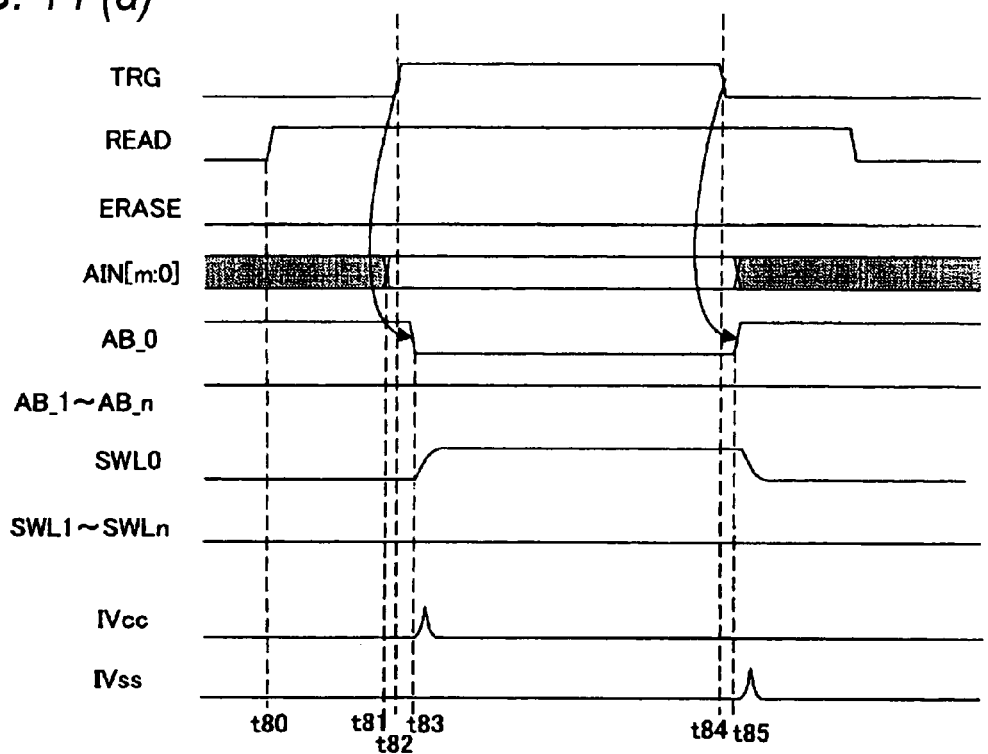
FIG. 14(a) is a timing chart for explaining an operation of the usual word line driving circuit in a reading mode and FIG. 14(b) is a timing chart for explaining the operation of the usual word line driving circuit in an erasing mode.
Figure 14:
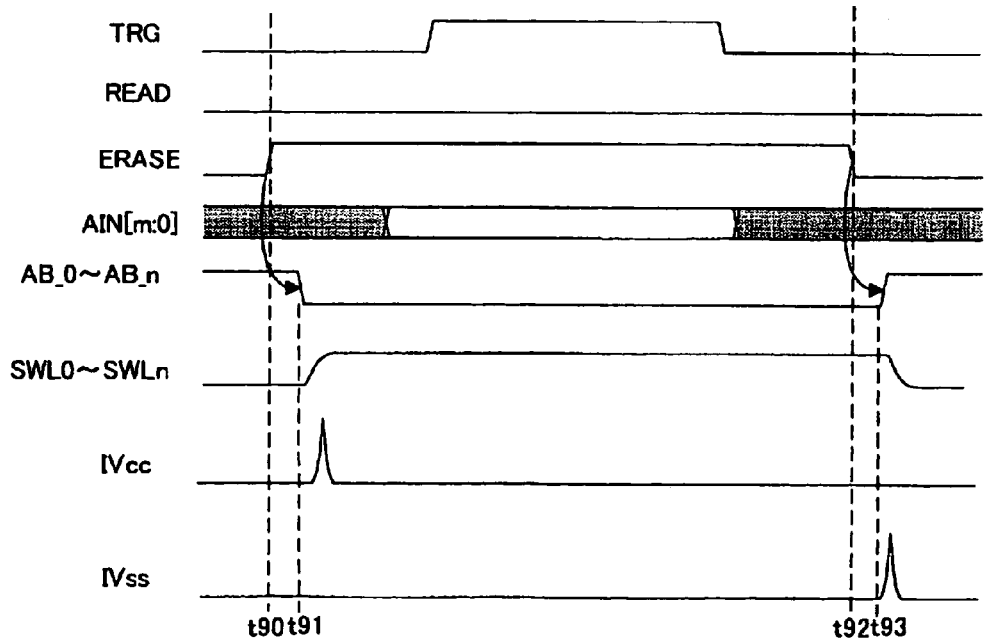

Now, the operation of the word line driving part shown in FIG. 11 will be described by referring to FIG. 12. FIG. 12(a) is a timing chart during a reading operation. When the reading operation is carried out, a READ signal is firstly inputted to the address decoder 110 (time t60). Then, an address signal AIN[m:0] for designating an address to be read is inputted (time t61). When the address signal AIN [m:0] is received, a signal for designating a selected word line of the second control signals (AB-0 to AB-n) corresponding to the low-order bit of the address control signal shifts from H to L (time t62). Here, since the word line (SWL0) is designated, the control signal (AB-0) shifts from H to L. At this time, the first control signal (AB-x) corresponding to the high-order bit of the address control signal inputted to the Pch transistor MPX is located at an H level. Accordingly, a source potential Vcc is not supplied to the selected word line (SWL0).

Then, a TRG signal showing the start of an operation shifts from L to H (time t63) and the control signal (AB-x) shifts from H to L (time t64). Thus, the source voltage is supplied to the word line SWL0 to carry out the reading operation.

At this time, since the electric current supplying capacity of the Pch transistor MPX is sufficient for driving one word line, the high speed characteristics of the reading operation are maintained as they are.

Further, when the reading operation is completed, at time t65, the TRG signal falls. At time t66, when AB-0 shifts to an H level, the electric current extracting transistor (MNX0) connected to the word line operates so that the potential of the word line SWL0 more rapidly shifts to the earth potential (time t67). Accordingly, the circuit operation can be performed at high speed. In this embodiment, since the complicated control signal does not need to be used in the address decoder 110, the structure of the address decoder 110 can be simplified.

FIG. 12(b) is a timing chart during an erasing operation. When the erasing operation is carried out, an ERASE signal is inputted to the address decoder 110 (time t70). When the ERASE signal is received, the control signals (AB-0 to AB-n) shift from H to L (time t71). Then, the control signal AB-x of the Pch transistor MPX shifts from H to L (time t72). The control signal AB-x shifts from H to L so that the source voltage is supplied to all the word lines (SWL0 to SWLn). The Nch transistor of each word line driving element circuit is already turned off, a through current does not flow.

Further, since the electric current supplying capacity of the Pch transistor MPX is restricted to a prescribed electric current supplying capacity, all the word lines slowly shift to the source potential Vcc (time t72 to time t73). A large quantity of transient current Ivcc does not flow so that the peak current can be reduced.

Further, when the erasing operation is completed, at time t74, the ERASE signal falls. At time t75, the control signal AB-0 shifts to an H level. Thus, the electric current extracting transistors (MNX0 to MNX2) respectively connected to the word lines operate and the potentials of the word lines (SWL0 to SWLn) more rapidly shift to the earth potential (time t76). Accordingly, the circuit operation can be performed at high speed.

The semiconductor storage device according to the present invention can effectively prevent the generation of the through current and reduce the peak current without deteriorating the high speed characteristics and is useful for a semiconductor storage device or the like mounted on an IC card or the like.

What is claimed is:

1. A semiconductor storage device including:
    a storing element part, having a memory cell provided at the intersection or a word line and a bit line; and
    a word line driving part for driving the word line in the storing element part, the word line driving part comprising:
        a plurality of word line driving element circuits, in which one word line is connected to a drain to which two MOS transistors having different electric conductive types are commonly connected and a first control signal is inputted to each of the gates of the MOS transistors;
        at least one transistor, provided between each of the word line driving element circuits and a source potential, having an electric current supplying capacity not lower than the electric current supplying capacity of each of the word line driving element circuits and not higher than the electric current supplying capacity of all the word line driving element circuits and whose operation is controlled by a second control signal different from the first control signals;
        an electric current extracting transistor, that has one end connected to each word line driven by each of the word line driving element circuits, its electric conductive type different from that of the above-described transistor and its operation controlled by the second control signal; and
        a control signal generating circuit, generating the first and second signals;
        wherein the control signal generating circuit allows the low-order bit of an address control signal, the address control signal being a base for generating the first and second control signals, to correspond to the first control signal and the high-order bit thereof to correspond to the second control signal.

* * * * *